(12) United States Patent
Choi et al.

(10) Patent No.: US 12,550,790 B2
(45) Date of Patent: Feb. 10, 2026

(54) STACKED INTEGRATED CIRCUIT (IC) PACKAGE

(71) Applicant: SAMSUNG ELECTRONICS CO., LTD., Suwon-si (KR)

(72) Inventors: Hun Seong Choi, Suwon-si (KR); Wooseok Chang, Suwon-si (KR); Junyeon Lee, Suwon-si (KR); Minkyu Kim, Suwon-si (KR); Byungwoo Bang, Suwon-si (KR); Jiye Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 513 days.

(21) Appl. No.: 18/184,029

(22) Filed: Mar. 15, 2023

(65) Prior Publication Data

US 2024/0079378 A1 Mar. 7, 2024

(30) Foreign Application Priority Data

Sep. 5, 2022 (KR) .................. 10-2022-0112253

(51) Int. Cl.
*H01L 25/065* (2023.01)
*H01L 23/50* (2006.01)
(Continued)

(52) U.S. Cl.
CPC .......... *H01L 25/0657* (2013.01); *H01L 23/50* (2013.01); *H01L 25/18* (2013.01);
(Continued)

(58) Field of Classification Search
None
See application file for complete search history.

(56) References Cited

U.S. PATENT DOCUMENTS 6,600,364 B1 7/2003 Liang et al.
10,651,156 B2 * 5/2020 Yu ........................ H01L 25/18
(Continued)

FOREIGN PATENT DOCUMENTS

KR 10-1923727 B1 11/2018
KR 10-2019-0105346 A 9/2019

OTHER PUBLICATIONS

Kim, Joohee, et al. "Overview of 3-D IC Design Technologies for Signal Integrity (SI) and Power Integrity (PI) of a TSV-Based 3D IC." *The Proceeding of the Korean Institute of Electromagnetic Engineering and Science* vol. 24. Issue 2 (2013). pp 3-14.
(Continued)

*Primary Examiner* — Hung K Vu
(74) *Attorney, Agent, or Firm* — NSIP Law (57) ABSTRACT

A stacked IC package includes a first die including a first power transmission region, an adapter die stacked on the first die, a second die stacked on the adapter die and including a second power transmission region, and a first power transmission path electrically connected between the second power transmission region and the first power transmission region through the adapter die. The first power transmission path includes a first power transmission part penetrating a portion of the adapter die in a vertical direction from the first power transmission region, a second power transmission part including a connected part in a horizontal direction from the first power transmission part in the adapter die, and a third power transmission part connected to the second power transmission region in the vertical direction from the second power transmission part. A voltage conversion circuit is arranged on the first power transmission path.

20 Claims, 8 Drawing Sheets

(51) Int. Cl.
    *H01L 25/18*          (2023.01)
    *H10B 80/00*          (2023.01)

(52) U.S. Cl.
    CPC .... *H10B 80/00* (2023.02); *H01L 2225/06544* (2013.01); *H01L 2225/06589* (2013.01)

(56) References Cited

U.S. PATENT DOCUMENTS

| | | |
|---|---|---|
| 2011/0042795 A1* | 2/2011 | Knickerbocker ............................ H01L 23/49827 257/E21.585 |
| 2012/0106117 A1 | 5/2012 | Sundaram et al. |
| 2014/0252632 A1* | 9/2014 | Barth .................. H01L 23/5384 257/773 |
| 2020/0358351 A1 | 11/2020 | Dabral et al. |
| 2020/0388603 A1 | 12/2020 | Sankman et al. |
| 2021/0366873 A1 | 11/2021 | Gandhi et al. |

OTHER PUBLICATIONS

Andersen, Toke M., et al. "A 10 W on-chip switched capacitor voltage regulator with feedforward regulation capability for granular microprocessor power delivery." *IEEE Transactions on Power Electronics* vol. 32. Issue 1 (2017). pp 377-393.

El Bouayadi, Ossama, et al. "Silicon interposer: A versatile platform towards full-3D integration of wireless systems at millimeter-wave frequencies." *2015 IEEE 65th Electronic Components and Technology Conference (ECTC)*. IEEE, (2015). pp 972-980.

Guan, Lim Teck, et al. "3D FOWLP integration." *2020 IEEE 70th Electronic Components and Technology Conference (ECTC)*. IEEE, (2020). pp 1728-1735.

Vivet, Pascal, et al. "2.3 A 220GOPS 96-Core Processor with 6 Chiplets 3D-Stacked on an Active Interposer Offering 0.6 ns/mm Latency, 3Tb/s/mm 2 Inter-Chiplet Interconnects and 156mW/mm 2@ 82%-Peak-Efficiency DC-DC Converters." *2020 IEEE International Solid-State Circuits Conference-(ISSCC)*. IEEE, (2020). pp 46-48.

Brunner, Jon, I. Wei Qin, and Bob Chylak. "Advanced wire bond looping technology for emerging packages." *IEEE/CPMT/SEMI 29th International Electronics Manufacturing Technology Symposium (IEEE Cat. No. 04CH37585)*. IEEE, (2004). pp 1-6.

Song, Eunseok, et al. "TSV-based decoupling capacitor schemes in 3D-IC." *2012 IEEE 62nd Electronic Components and Technology Conference*. IEEE, (2012). pp. 1340-1344.

* cited by examiner

STACKED INTEGRATED CIRCUIT (IC) PACKAGE

CROSS-REFERENCE TO RELATED APPLICATIONS

This application claims the benefit under 35 USC § 119(a) of Korean Patent Application No. 10-2022-0112253, filed on Sep. 5, 2022, in the Korean Intellectual Property Office, the entire disclosure of which is incorporated herein by reference for all purposes.

BACKGROUND

1. Field

The following description relates to a stacked integrated circuit (IC) package.

2. Description of Related Art

With the widespread use of portable electronic devices and development of various electronic devices requiring high performance, various integrated circuit (IC) packages are proposed to integrate large-capacity memory chips in a limited form factor as much as possible. More particularly, research has been actively conducted on an IC package that improves the degree of integration by vertically stacking a plurality of memory chips. For example, an IC package may be formed by stacking a logic die for operation and control and a memory die for data storage. To electrically connect a logic die and a memory die, which are vertically stacked, to one another a through silicon via (TSV) may be formed in a vertical direction. On the other hand, typically, memory dies are mass-produced in small quantities once a memory die is designed while a logic die is individually designed for each purpose. Therefore, typically, when designing a logic die, the logic die is designed based on a memory die of which the design has already been determined. Since the TSV is formed in the vertical direction, when designing the logic die, there is a limit that the TSV may need to be formed at a location coinciding in the vertical direction with the TSV formed in the memory die. As described above, the location where the TSV needs to be formed in the logic die may be referred to as a TSV keep out zone (KoZ), and a separate circuit element may not be arranged in the TSV KoZ. Accordingly, when designing a logic die based on the shape of a memory die, there is a difficulty in arranging various sizes of circuit elements (e.g., a large-sized circuit element) in the logic die due to a limited location of a TSV, such as the TSV KoZ.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a stacked integrated circuit (IC) package includes a first die including a first power transmission region, a first adapter die stacked on the first die, a second die stacked on the first adapter die and including a second power transmission region, and a first power transmission path electrically connected between the second power transmission region and the first power transmission region through the first adapter die. The first power transmission path includes include a first power transmission part penetrating at least a portion of the first adapter die in a vertical direction from the first power transmission region, a second power transmission part including a connected part in a horizontal direction from the first power transmission part in the first adapter die, and a third power transmission part connected to the second power transmission region in the vertical direction from the second power transmission part. A voltage conversion circuit is arranged on the first power transmission path.

At least a portion of the first power transmission region may not overlap the second power transmission region in the vertical direction.

The voltage conversion circuit may be arranged on the second power transmission part.

The second power transmission part may be formed of a mesh type.

The first adapter die may be formed of silicone or a metal material.

The first adapter die may be configured to distribute heat generated in the first die or the second die.

The first die may include a first signal transmission region, and the second die may include a second signal transmission region, and the stacked IC package may include a first signal transmission path electrically connected between the second signal transmission region and the first signal transmission region through the first adapter die.

The first signal transmission path may include a first signal transmission part penetrating at least a portion of the first adapter die in the vertical direction from the first signal transmission region, a second signal transmission part including a connected part in the horizontal direction from the first signal transmission part in the first adapter die, and a third signal transmission part connected to the second signal transmission region in the vertical direction from the second signal transmission part.

At least a portion of the first signal transmission region may not overlap the second signal transmission region in the vertical direction.

A level shift circuit may be arranged on the first signal transmission path.

Static read-only memory (SRAM) and at least one of a power management circuit for the first die and a power management circuit for the second die may be arranged in the first adapter die.

The first die may include any one of a logic die and a memory die, and the second die may include any one of a logic die and a memory die.

The voltage conversion circuit may be implemented in an on-chip type and disposed on the first adapter die.

The stacked IC package may further include a third die stacked on the second die and including a third power transmission region, and a second power transmission path electrically connected between the third power transmission region and the first power transmission region through the first adapter die and the second die, the second power transmission path may include a fourth power transmission part penetrating at least a portion of the first adapter die in the vertical direction from the first power transmission region, a fifth power transmission part including a connected part in the horizontal direction from the fourth power transmission part in the first adapter die, and a sixth power transmission part connected to the third power transmission region in the vertical direction from the fifth power transmission part by penetrating the second die, and a second voltage conversion circuit may be arranged on the fifth power transmission part.

The stacked IC package may further include a second adapter die stacked on the second die, a third die stacked on the second adapter die and including a third power transmission region, and a second power transmission path electrically connected between the third power transmission region and the first power transmission region through the first adapter die, the second die, and the second adapter die, the second power transmission path may include a fourth power transmission part penetrating at least a portion of the second adapter die in the vertical direction from the first power transmission region by penetrating the first adapter die and the second die, a fifth power transmission part including a connected part in a horizontal direction from the fourth power transmission part in the second adapter die, and a sixth power transmission part connected to the third power transmission region in the vertical direction from the fifth power transmission part, and a second voltage conversion circuit may be arranged on the fifth power transmission part.

In another general aspect, a stacked IC package includes a logic die including a first power transmission region, an adapter die stacked on the logic die, a memory die stacked on the adapter die and including a second power transmission region, and a power transmission path electrically connected between the second power transmission region and the first power transmission region through the adapter die. The power transmission path includes a first power transmission part penetrating at least a portion of the adapter die in a vertical direction from the power transmission region, a second power transmission part including a connected part in a horizontal direction from the first power transmission part in the adapter die, and a third power transmission part connected to the second power transmission region in the vertical direction from the second power transmission part, wherein a voltage conversion circuit may be arranged in the second power transmission part, and at least a portion of the first power transmission region does not overlap the second power transmission region in the vertical direction.

The second power transmission part may be formed of a mesh type.

The adapter die may be formed of silicone or a metal material and may be configured to distribute heat generated in the logic die or the memory die.

A power management circuit for the memory die may be arranged in the adapter die.

The logic die may include a first signal transmission region, the memory die may include a second signal transmission region, and the stacked IC package may include a first signal transmission path electrically connected between the second signal transmission region and the first signal transmission region through the adapter die.

In another general aspect, a stacked IC package includes a first die; an adapter die disposed on the first die along a first direction; a second die disposed on the adapter die along the first direction such that the adapter die is at least partially disposed between the first die and the second die; a first power transmission part extending along the first direction from a first end disposed at the first die to a second end disposed at the adapter die; a second power transmission part extending along the first direction from a first end disposed at the second die to a second end disposed at the adapter die; a third power transmission part extending in the first adapter die along a direction traverse to the first direction from the second end of the first power transmission part to the second end of the second power transmission part; and a voltage conversion circuit arranged on one of the first power transmission part, the second power transmission part, and the third power transmission part.

The voltage conversion circuit may be arranged on the third power transmission part.

The first die may be a logic die and the second die may be a memory die.

The first end of the first power transmission part may be disposed in a first power transmission region of the first die, and the first end of the second power transmission part may be disposed in a second power transmission region of the second die.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative sizes, proportions, and depiction of elements in the drawings may be exaggerated for clarity, illustration, and convenience.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Also, in the description of the components, terms such as first, second, A, B, (a), (b) or the like may be used herein when describing components of the various examples. These terms are used only for the purpose of discriminating one constituent element from another constituent element, and the nature, the sequences, or the orders of the constituent elements are not limited by the terms.

The same name may be used to describe an element included in the examples described above and an element having a common function. Unless otherwise mentioned, the descriptions on the examples may be applicable to the following examples and thus, duplicated descriptions will be omitted for conciseness.

Figure 1A:
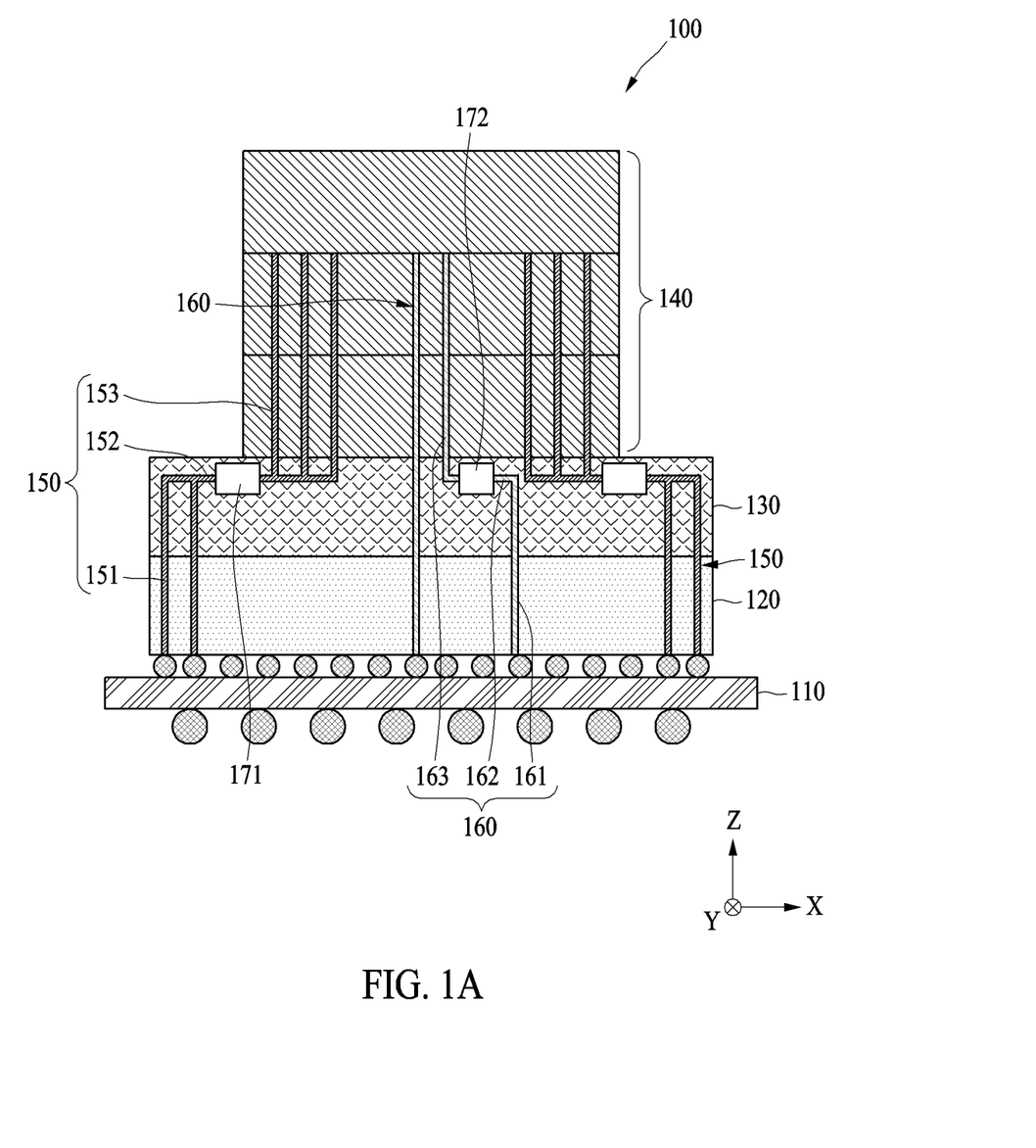
FIG. 1A is a schematic cross-sectional view illustrating an internal connection path of a stacked integrated circuit (IC) package, according to an example.
Figure 1B:
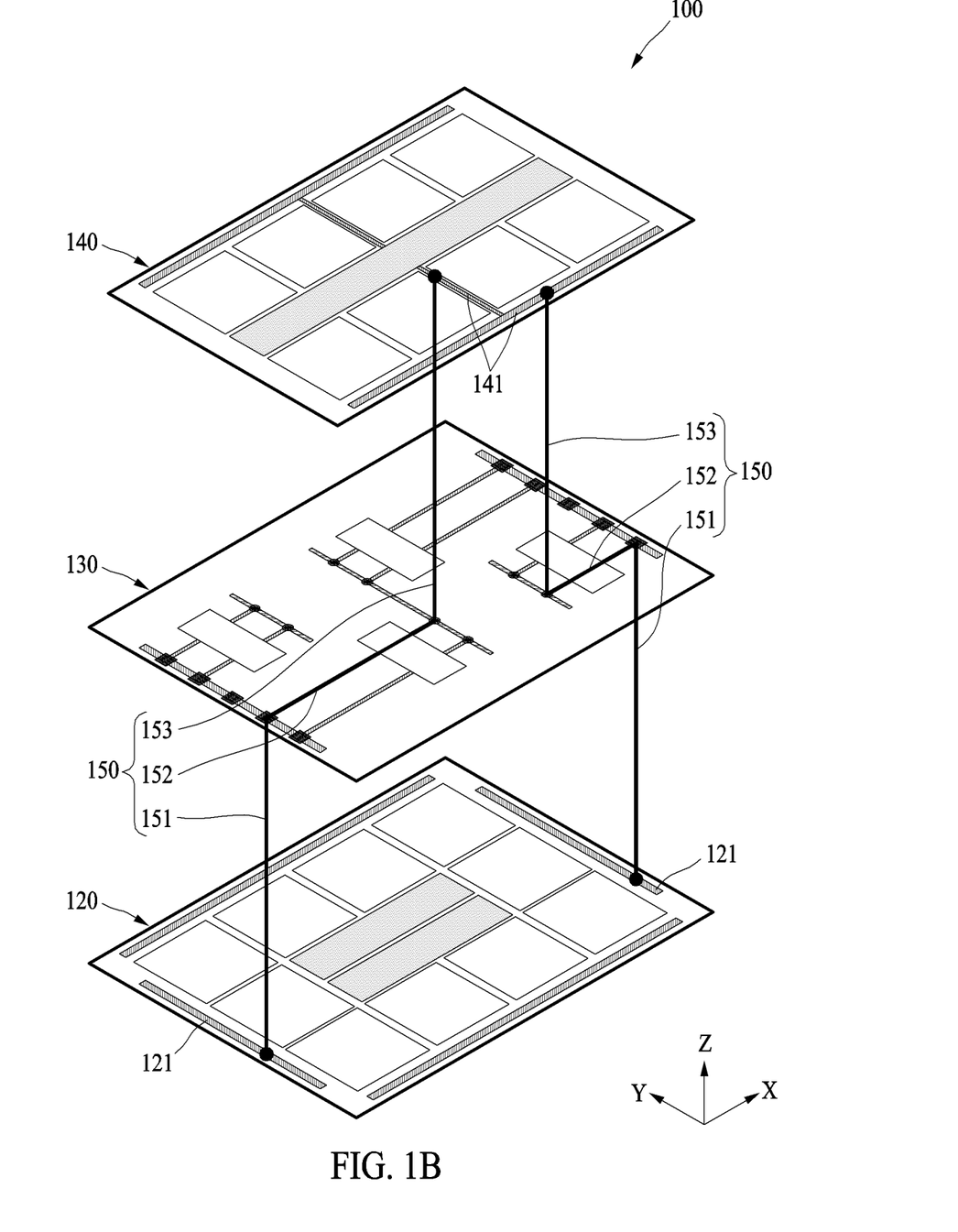
FIG. 1B is a schematic perspective view illustrating a portion of an internal connection path of a stacked IC package, according to an example.
Figure 1C:
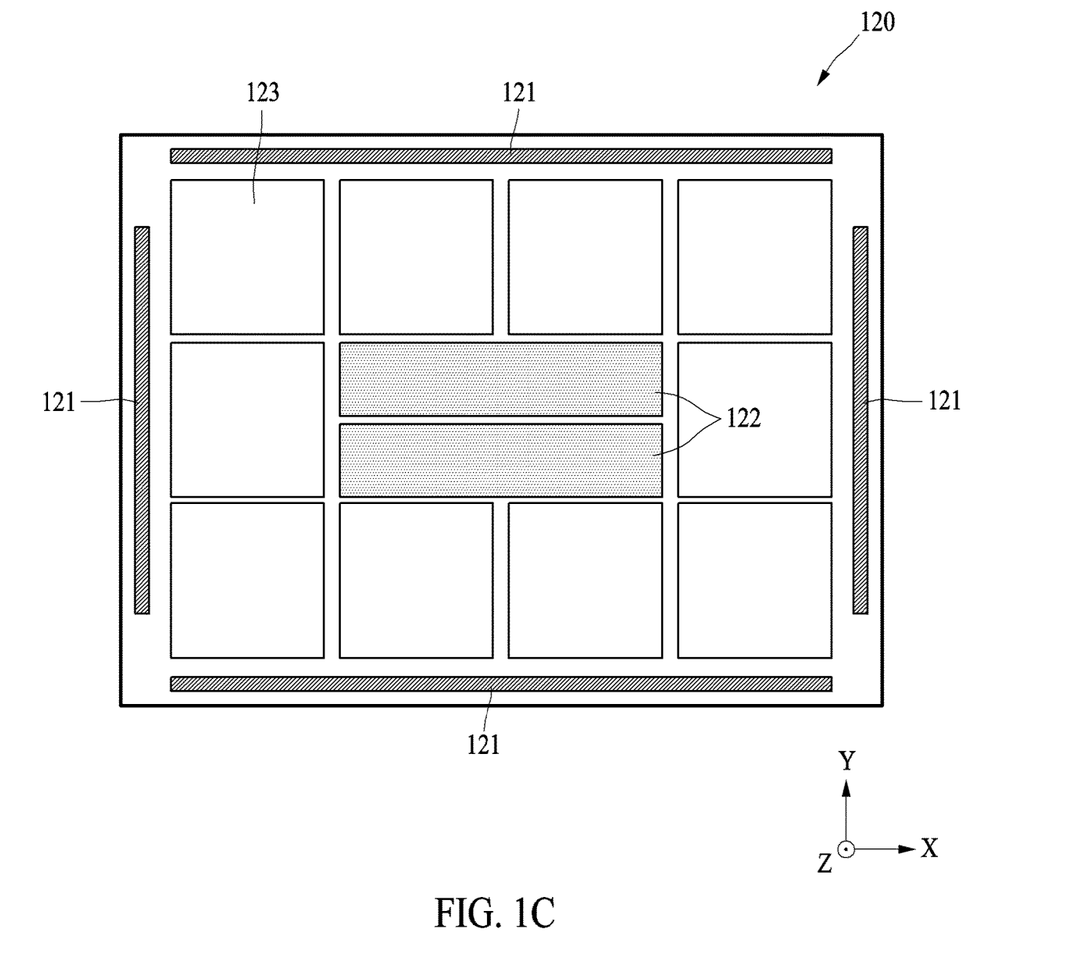
FIG. 1C is a schematic plan view illustrating a first die according to an example.
Figure 1D:
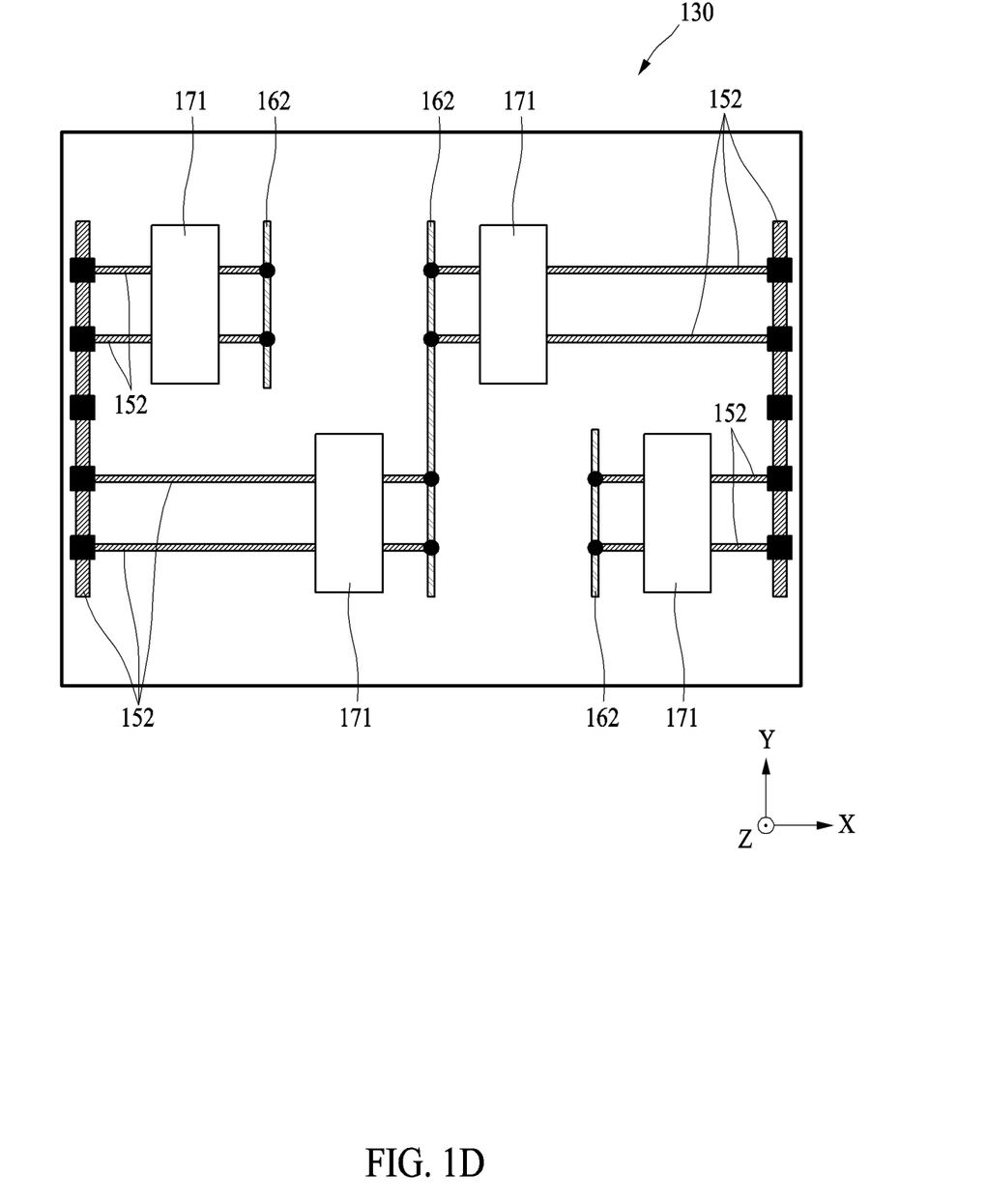
FIG. 1D is a schematic plan view illustrating an adapter die according to an example.
Figure 1E:
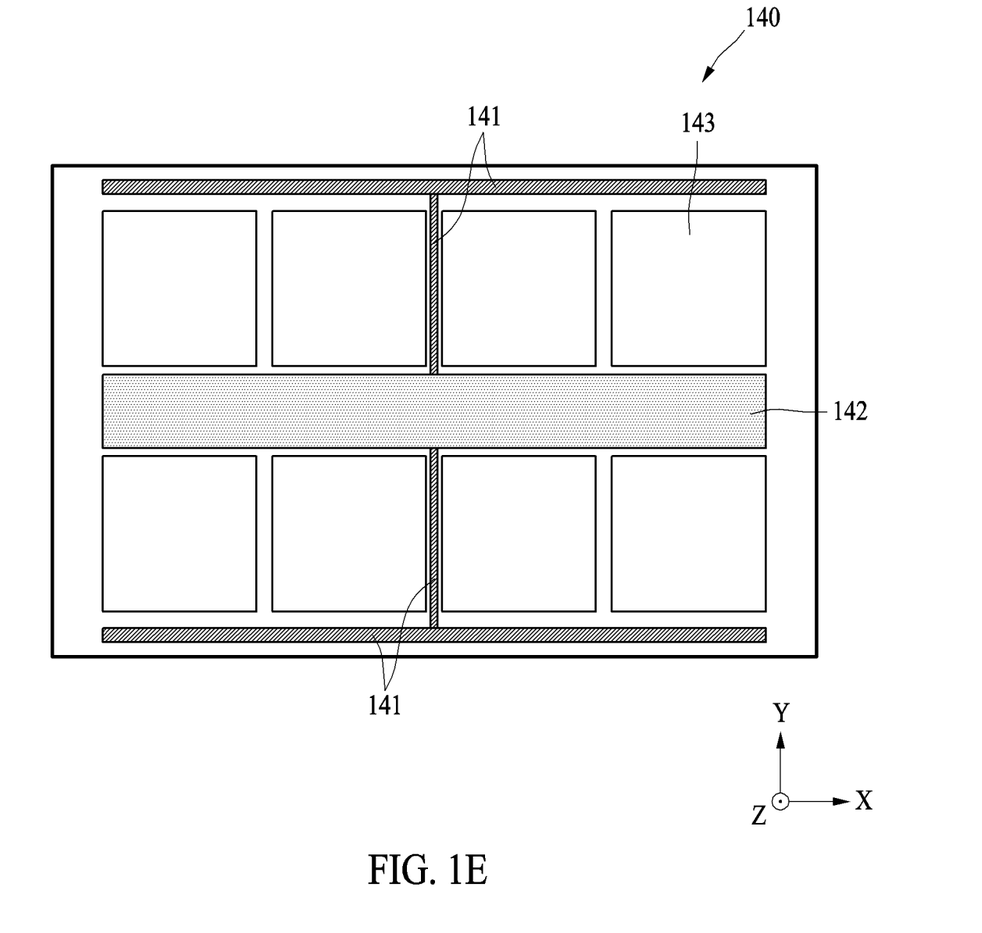
FIG. 1E is a schematic plan view illustrating a second die according to an example.

FIG. 1A is a schematic cross-sectional view illustrating an internal connection path of a stacked integrated circuit (IC) package, according to an example. FIG. 1B is a schematic perspective view illustrating a portion of an internal connection path of a stacked IC package, according to an example. FIG. 10 is a schematic plan view illustrating a first die according to an example. FIG. 1D is a schematic plan view illustrating an adapter die according to example. FIG. 1E is a schematic plan view illustrating a second die according to example.

Referring to FIGS. 1A to 1E, a stacked IC package 100 may be formed by stacking a plurality of dies. For example, the stacked IC package 100 may include a package substrate 110, a first die 120, a first adapter die 130, a second die 140, a first power transmission path 150, and a first signal transmission path 160.

In one example, the package substrate 110 may constitute a base of the stacked IC package 100. A plurality of dies may be stacked on the package substrate 110. For example, the first die 120, the first adapter die 130, and/or the second die 140 may be stacked on the package substrate 110.

In one example, the first die 120 may be stacked on the package substrate 110. For example, the first die 120 may be stacked on the top surface (e.g., the +z direction surface) of the package substrate 110. The first die 120 may be any one of a logic die and a memory die. However, this is merely an example, and the type of the first die 120 is not limited thereto. The first die 120 may include a first power transmission region 121, a first signal transmission region 122, and a first core 123.

In one example, the first power transmission region 121 may be a region for transmitting or receiving power. For example, the first die 120 may receive power from the package substrate 110 through the first power transmission region 121. For example, the first power transmission region 121 may be connected to the first power transmission path 150 for transmitting power to the second die 140. The first power transmission region 121 may be a region in which a plurality of points, which may be connected to the first power transmission path 150, are distributed. For example, as illustrated in FIG. 10, the first power transmission region 121 may be formed in the edge region of the first die 120. However, this is merely an example, and the number, shape, and/or location of the first power transmission region 121 are not limited thereto.

In one example, the first signal transmission region 122 may be a region for transmitting or receiving a signal. For example, the first die 120 may be configured to receive a signal from the package substrate 110 and/or the second die 140 through the first signal transmission region 122 or transmit a signal to the package substrate 110 and/or the second die 140 through the first signal transmission region 122. For example, the first signal transmission region 122 may be connected to the first signal transmission path 160 configured to transmit a signal to the second die 140 or receive a signal from the second die 140. The first signal transmission region 122 may be a region in which a plurality of points, which may be connected to the first signal transmission path 160, are distributed. For example, as illustrated in FIG. 10, the first signal transmission region 122 may be formed in the central region of the first die 120. However, this is merely an example, and the number, shape, and/or location of the first signal transmission region 122 are not limited thereto.

In one example, one or a plurality of first cores 123 may be arranged in the first die 120. The first core 123 may be a circuit element and/or a circuit module arranged in the first die 120. The size, shape, number and/or arrangement of the first core 123 illustrated in FIG. 10 are an example and note limited thereto. For example, the first core 123 arranged in the first die 120 may be various cores having various sizes, shapes, and/or quantities.

In one example, the first adapter die 130 may be stacked on the first die 120. For example, the first adapter die 130 may be stacked on the top surface (e.g., the +z direction surface) of the first die 120. The first adapter die 130 may be configured to connect the first die 120 to the second die 140. For example, the first adapter die 130 may be between the first die 120 and the second die 140 and may electrically connect the first die 120 to the second die 140. The first adapter die 130 may connect the first power transmission region 121 of the first die 120 to a second power transmission region 141 of the second die 140. The first adapter die 130 may connect the first signal transmission region 122 of the first die 120 to a second signal transmission region 142 of the second die 140. For example, the first adapter die 130 may have substantially the same or similar surface area (e.g., an area size in the x-y direction) to the first die 120. For example, the first adapter die 130 may have substantially the same or similar thickness to the first die 120 and/or the second die 140. For example, the thickness of the first adapter die 130 may be several tens of μm. However, this is merely an example, and the material, shape, and/or size of the first adapter die 130 are not limited thereto.

In one example, the second die 140 may be stacked on the first adapter die 130. For example, the second die 140 may be stacked on the top surface (e.g., the +z direction surface) of the first adapter die 130. The second die 140 may be any one of a logic die and a memory die. For example, the first die 120 may be a logic die and the second die 140 may be a memory die. For example, the first die 120 may be a memory die and the second die 140 may be a logic die. For example, the first die 120 may be a logic die and the second die 140 may be a logic die. However, this is merely an example, and the type of the first die 120 and/or the second die 140 is not limited thereto. The second die 140 may include the second power transmission region 141, the second signal transmission region 142, and a second core 143.

In one example, the second power transmission region 141 may be a region for transmitting or receiving power. For example, the second die 140 may receive power from the package substrate 110 and/or the first die 120 through the second power transmission region 141. For example, the second power transmission region 141 may be connected to the first power transmission path 150 for receiving power from the package substrate 110 and/or the first die 120. The second power transmission region 141 may be a region in which a plurality of points, which may be connected to the first power transmission path 150, are distributed. At least some of the first power transmission region 121 of the first die 120 and the second power transmission region 141 of the second die 140 may not overlap with each other in the vertical direction (e.g., the z direction). For example, as illustrated in FIG. 1E, the second power transmission region 141 may be formed in the edge region or the central region of the second die 140. However, this is only an example, and the number, shape, and/or location of the second power transmission region 141 are not limited thereto.

In one example, the second signal transmission region 142 may be a region for transmitting or receiving a signal. For example, the second die 140 may be configured to receive a signal from the package substrate 110 and/or the first die 120 through the second signal transmission region 142 or transmit a signal to the package substrate 110 and/or the first die 120 through the second signal transmission region 142. For example, the second signal transmission region 142 may be connected to the first signal transmission path 160 configured to transmit a signal to the first die 120 or receive a signal from the first die 120. The second signal transmission region 142 may be a region in which a plurality of points, which may be connected to the first signal transmission path 160, are distributed. At least some of the first signal transmission region 122 of the first die 120 and the second signal transmission region 142 of the second die 140 may not overlap with each other in the vertical direction (e.g., the z direction). For example, as illustrated in FIG. 1E, the second signal transmission region 142 may be formed in the central region of the second die 140. However, this is merely an example, and the number, shape, and/or location of the second signal transmission region 142 are not limited thereto.

In one example, one or a plurality of second cores 143 may be arranged in the second die 140. The second core 143 may be a circuit element and/or a circuit module arranged in the second die 140. The size, shape, number and/or arrangement of the second core 143 illustrated in FIG. 1E are an example and not limited to such a configuration. For example, the second core 143 arranged in the second die 140 may be various cores having various sizes, shapes, and/or quantities.

In one example, the first power transmission path 150 may be a path configured to transmit power between components (e.g., the package substrate 110, the first die 120, and/or the second die 140). For example, the first power transmission path 150 may be a path configured to transmit power from the package substrate 110 to the first die 120 and/or the second die 140. The first power transmission path 150 may be electrically connected to the second power transmission region 141 of the second die 140 by passing through the first adapter die 130 from the first power transmission region 121 of the first die 120. For example, at least a portion of the first power transmission path 150 may be formed of a through silicon via (TSV). For example, at least one first power transmission path 150 may be provided.

In one example, the first power transmission path 150 may include a first power transmission part 151, a second power transmission part 152, and a third power transmission part 153.

In one example, the first power transmission part 151 may penetrate at least a portion of the first adapter die 130 in the vertical direction (e.g., the z direction) from the first power transmission region 121 of the first die 120. For example, the first power transmission part 151 may penetrate the lower portion (e.g., the portion in the −z direction) of the first adapter die 130 in the vertical direction (e.g., the z direction). For example, the first power transmission part 151 may include a TSV.

In one example, the second power transmission part 152 may be formed inside the first adapter die 130. The second power transmission part 152 may include a connected part in the horizontal direction (e.g., the x/y direction) from the first power transmission part 151 in the first adapter die 130. For example, the second power transmission part 152 may be formed on the top portion (e.g., the portion in the +z direction) of the first adapter die 130. For example, as illustrated in FIG. 1D, the second power transmission part 152 may be formed in a mesh type. For example, at least a portion of the second power transmission part 152 may be connected to a second signal transmission part 162. The second power transmission part 152 illustrated in the drawings is an example, and the second power transmission part 152 may include a connected part in the vertical direction (e.g., the z direction). For example, the top portion (e.g., the portion in the +z direction) of the first adapter die 130 may be formed of a plurality of layers and the second power transmission part 152 may include a connecting part in the vertical direction (e.g., the z direction) that connects a horizontal (e.g., the x/y direction) part included in each layer and a horizontal (e.g., the x/y direction) part included in each layer.

In one example, the third power transmission part 153 may be connected to the second power transmission region 141 in the vertical direction (e.g., the z direction) from the second power transmission part 152. For example, the third power transmission part 153 may include a TSV.

In one example, according to the power transmission structure described above, when the first power transmission region 121 of the first die 120 and the second power transmission region 141 of the second die 140 do not overlap each other in the vertical direction (e.g., the z direction), the first power transmission region 121 may be electrically connected to the second power transmission region 141 through the first adapter die 130. Accordingly, the first power transmission region 121 of the first die 120 and/or the second power transmission region 141 of the second die 140 may be designed to be at an arbitrary location, and a spatial limitation that occurs when arranging the first die 120 and/or the second die 140 may decrease. However, this is merely an example, and at a location in which the first power transmission region 121 of the first die 120 and the second power transmission region 141 of the second die 140 overlap each other in the vertical direction (e.g., the z direction), the first power transmission path 150 may be formed in the vertical direction (e.g., the z direction) from the first power transmission region 121 to the second power transmission region 141 through the first adapter die 130.

In one example, a voltage conversion circuit 171 may be arranged on the first power transmission path 150. For example, the voltage conversion circuit 171 may be arranged on the second power transmission part 152. For example, the voltage conversion circuit 171 may be implemented in an on-chip type and formed on the first adapter die 130. For example, the voltage conversion circuit 171 may include a direct current (DC) converter or a DC regulator. However, this is merely an example, and the location, installation type, and/or type of the voltage conversion circuit 171 are not limited thereto. For example, when a supplied voltage is different from the voltage required by the first die 120 and/or the second die 140, the voltage conversion circuit 171 may convert the supplied voltage into the voltage required by the first die 120 and/or the second die 140. For example, the voltage conversion circuit 171 may compensate a voltage for IR drop. According to the structure described above, when a voltage required by the first die 120 is different from a voltage required by the second die 140, the first die 120 may be easily connected to the second die 140 through the first adapter die 130 including the voltage conversion circuit 171.

In one example, the first signal transmission path 160 may be a path configured to transmit a signal between components (e.g., the package substrate 110, the first die 120, and/or the second die 140). The first signal transmission path 160 may be electrically connected to the second signal transmission region 142 of the second die 140 by passing through the first adapter die 130 from the first signal transmission region 122 of the first die 120. For example, at least a portion of the first signal transmission path 160 may include a TSV. For example, at least one first signal transmission path 160 may be provided.

In one example, the first signal transmission path 160 may include a first signal transmission part 161, the second signal transmission part 162, and a third signal transmission part 163.

In one example, the first signal transmission part 161 may penetrate at least a portion of the first adapter die 130 in the vertical direction (e.g., the z direction) from the first signal transmission region 122 of the first die 120. For example, the first signal transmission part 161 may penetrate the lower portion (e.g., the portion in the −z direction) of the first adapter die 130 in the vertical direction (e.g., the z direction). For example, the first signal transmission part 161 may include a TSV.

In one example, the second signal transmission part 162 may be formed inside the first adapter die 130. The second signal transmission part 162 may include a connected part in the horizontal direction (e.g., the x/y direction) from the first signal transmission part 161 in the first adapter die 130. For example, the second signal transmission part 162 may be formed on the top portion (e.g., the portion in the +z direction) of the first adapter die 130. For example, as illustrated in FIG. 1D, the second signal transmission part 162 may be formed in a mesh type. For example, at least a portion of the second signal transmission part 162 may be connected to the second power transmission part 152. The second signal transmission part 162 illustrated in the drawings is an example, and the second signal transmission part 162 may include a connected part in the vertical direction (e.g., the z direction). For example, the top portion (e.g., the portion in the +z direction) of the first adapter die 130 may be formed of a plurality of layers and the second signal transmission part 162 may include a connecting part in the vertical direction (e.g., the z direction) that connects a horizontal (e.g., the x/y direction) part included in each layer and a horizontal (e.g., the x/y direction) part included in each layer.

In one example, the third signal transmission part 163 may be connected to the second signal transmission region 142 in the vertical direction (e.g., the z direction) from the second signal transmission part 162. For example, the third signal transmission part 163 may include a TSV.

In one example, according to the signal transmission structure described herein, when the first signal transmission region 122 of the first die 120 and the second signal transmission region 142 of the second die 140 do not overlap each other in the vertical direction (e.g., the z direction), the first signal transmission region 122 may be electrically connected to the second signal transmission region 142 through the first adapter die 130. Accordingly, the first signal transmission region 122 of the first die 120 and/or the second signal transmission region 142 of the second die 140 may be designed to be at an arbitrary location, and a spatial limitation that occurs when arranging an element (e.g., the first core 123 of FIG. 1D and/or the second core 143 of FIG. 1E) in the first die 120 and/or the second die 140 may decrease. For example, when designing the first die 120 and/or the second die 140, the first core 123 and/or the second core 143 having various sizes, shapes, and/or quantities may be designed in various arrangements without a spatial limitation. However, this is merely an example, and at a location in which the first signal transmission region 122 of the first die 120 and the second signal transmission region 142 of the second die 140 overlap each other in the vertical direction (e.g., the z direction), the first signal transmission path 160 may be formed in the vertical direction (e.g., the z direction) from the first signal transmission region 122 to the second signal transmission region 142 through the first adapter die 130.

In one example, a level shift circuit 172 may be arranged on the first signal transmission path 160. For example, the level shift circuit 172 may be arranged on the second signal transmission part 162. For example, the level shift circuit 172 may be implemented in an on-chip type and formed on the first adapter die 130. However, this is merely an example, and the location, installation type, and/or type of the level shift circuit 172 are not limited thereto. For example, when a voltage of a transmitted signal is different from a voltage of a signal required by the first die 120 and/or the second die 140, the level shift circuit 172 may convert the voltage of the transmitted signal to the voltage of the signal required by the first die 120 and/or the second die 140. According to the structure described above, when a voltage of a signal required by the first die 120 is different from a voltage of a signal required by the second die 140, the first die 120 may be easily connected to the second die 140 through the first adapter die 130 including the level shift circuit 172.

In one example, static read-only memory (SRAM) (not illustrated) may be arranged in the first adapter die 130. The SRAM arranged in the first adapter die 130 may be electrically connected to the package substrate 110, the first die 120, and/or the second die 140. For example, the SRAM may be arranged on the first signal transmission path 160 between the first die 120 and the second die 140. By arranging the SRAM in the first adapter die 130, the overall performance of the stacked IC package 100 may improve. This is merely an example configuration, and the circuit element arranged in the first adapter die 130 is not limited thereto.

In one example, a power management circuit (not illustrated) for the first die 120 and/or the second die 140 may be arranged in the first adapter die 130. The power management circuit arranged in the first adapter die 130 may be electrically connected to the package substrate 110, the first die 120, and/or the second die 140. For example, the power management circuit may be arranged on the first power transmission path 150 between the first die 120 and the second die 140. For example, when the first die 120 is a logic die and the second die 140 is a memory die, a power management circuit for the memory die may be arranged in the first adapter die 130. By arranging the power management circuit (not illustrated) for the first die 120 and/or the second die 140 in the first adapter die 130, a separate power management circuit in the first die 120 and/or the second die 140 may be omitted, and thus, a space of the first die 120 and/or the second die 140 may be efficiently used. This is merely an example configuration, and the circuit element for the first die 120 and/or the second die 140 arranged in the first adapter die 130 is not limited thereto.

In one example, the first adapter die 130 may distribute heat generated in the first die 120 and/or the second die 140. For example, the first adapter die 130 may include a material having high heat conductivity. For example, the first adapter die 130 may include silicone and/or a metal material. By arranging the first adapter die 130 between the first die 120 and the second die 140, heat generated in the first die 120 and/or the second die 140 may be transmitted to the first adapter die 130 and may be distributed in the horizontal direction (e.g., the x/y direction) in the first adapter die 130. As heat transmitted to the first adapter die 130 is distributed in the horizontal direction (e.g., the x/y direction), the heatproof effect may increase. Accordingly, the first adapter die 130 may decrease transmission of heat generated in any one of the first die 120 and the second die 140 to the other one.

Figure 2:
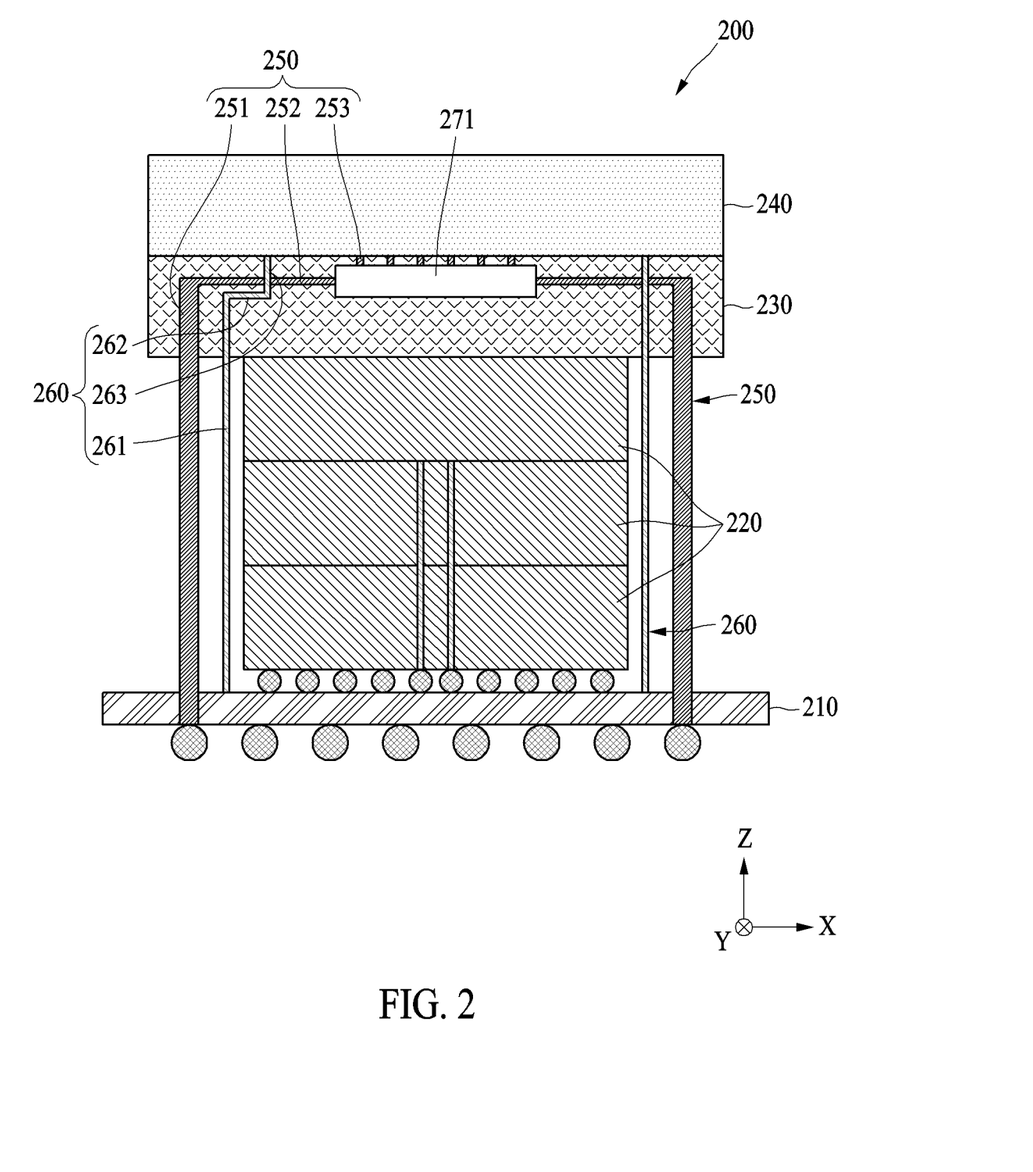
FIG. 2 is a schematic cross-sectional view illustrating an internal connection path of a stacked IC package according to an example.

FIG. 2 is a schematic cross-sectional view illustrating an internal connection path of a stacked IC package according to an example.

Referring to FIG. 2, a stacked IC package 200 according to one example may be formed by stacking a plurality of dies. For example, the stacked IC package 200 may include a package substrate 210, a first die 220, a first adapter die 230, a second die 240, a first power transmission path 250, and a first signal transmission path 260. To describe the stacked IC package 200 with reference to FIG. 2, detailed descriptions that are substantially the same as those of the stacked IC package 100 provided with reference to FIGS. 1A to 1E are omitted. The description of the configuration of the stacked IC package 100 of FIGS. 1A to 1E may apply to the stacked IC package 200 of FIG. 2 without departing from the scope.

In one example, as illustrated in FIG. 2, the package substrate 210, the first die 220, the first adapter die 230, and the second die 240 may be sequentially stacked. For example, the first die 220 may be stacked on the package substrate 210, the first adapter die 230 may be stacked on the first die 220, and the second die 240 may be stacked on the first adapter die 230. The first die 220 and/or the second die 240 may be a memory die and/or a logic die. For example, the first die 220 may be a memory die and the second die 240 may be a logic die. However, this is merely an example, and the type of the first die 220 and/or the second die 240 is not limited thereto.

In one example, the first power transmission path 250 may be a path configured to transmit power between components (e.g., the package substrate 210, the first die 220, and/or the second die 240). For example, the first power transmission path 250 may be a path configured to transmit power from the package substrate 210 to the second die 240. The first power transmission path 250 may be electrically connected to the second die 240 from the package substrate 210 through the first adapter die 230. For example, at least a portion of the first power transmission path 250 may include a TSV. For example, a least one first power transmission path 250 may be provided.

In one example, the first power transmission path 250 may include a first power transmission part 251, a second power transmission part 252, and a third power transmission part 253.

In one example, the first power transmission part 251 may penetrate at least a portion of the first adapter die 230 in the vertical direction (e.g., the z direction) from the package substrate 210. For example, the first power transmission part 251 may penetrate the lower portion (e.g., the portion in the −z direction) of the first adapter die 230 in the vertical direction (e.g., the z direction). For example, the first power transmission part 251 may include a TSV. For example, the first power transmission part 251 may be formed in a pillar shape.

In one example, the second power transmission part 252 may be formed inside the first adapter die 230. The second power transmission part 252 may include a connected part in the horizontal direction (e.g., the x/y direction) from the first power transmission part 251 in the first adapter die 230. For example, the second power transmission part 252 may be formed on the top portion (e.g., the portion in the +z direction) of the first adapter die 230. For example, the second power transmission part 252 may be formed in a mesh type. For example, at least a portion of the second power transmission part 252 may be connected to the second signal transmission part 262. The second power transmission part 252 illustrated in the drawings is an example and the second power transmission part 252 may include a connected part in the vertical direction (e.g., the z direction). For example, the top portion (e.g., the portion in the +z direction) of the first adapter die 230 may be formed of a plurality of layers and the second power transmission part 252 may include a connecting part in the vertical direction (e.g., the z direction) that connects a horizontal (e.g., the x/y direction) part included in each layer and a horizontal (e.g., the x/y direction) part included in each layer.

In one example, the third power transmission part 253 may be connected to the second die 240 (e.g., a power transmission region of the second die 240) in the vertical direction (e.g., the z direction) from the second power transmission part 252. For example, the third power transmission part 253 may include a TSV.

In one example, a voltage conversion circuit 271 may be arranged on the first power transmission path 250. For example, the voltage conversion circuit 271 may be arranged on the second power transmission part 252.

In one example, the first signal transmission path 260 may be a path configured to transmit a signal between components (e.g., the package substrate 210, the first die 220, and/or the second die 240). The first signal transmission path 260 may be electrically connected to the second die 240 from the package substrate 210 through the first adapter die 230. For example, at least a portion of the first signal transmission path 260 may include a TSV. For example, at least one first signal transmission path 260 may be provided.

In one example, the first signal transmission path 260 may include a first signal transmission part 261, the second signal transmission part 262, and a third signal transmission part 263.

In one example, the first signal transmission part 261 may penetrate at least a portion of the first adapter die 230 in the vertical direction (e.g., the z direction) from the package substrate 210. For example, the first signal transmission part 261 may penetrate the lower portion (e.g., the portion in the −z direction) of the first adapter die 230 in the vertical direction (e.g., the z direction). For example, the first signal transmission part 261 may include a TSV. For example, the first signal transmission part 261 may be formed in a pillar shape.

In one example, the second signal transmission part 262 may be formed inside the first adapter die 230. The second signal transmission part 262 may include a connected part in the horizontal direction (e.g., the x/y direction) from the first signal transmission part 261 in the first adapter die 230. For example, the second signal transmission part 262 may be formed on the top portion (e.g., the portion in the +z direction) of the first adapter die 230. For example, the second signal transmission part 262 may be formed in a mesh type. For example, at least a portion of the second signal transmission part 262 may be connected to the second power transmission part 252. The second signal transmission part 262 illustrated in the drawings is an example and the second signal transmission part 262 may include a connected part in the vertical direction (e.g., the z direction). For example, the top portion (e.g., the portion in the +z direction) of the first adapter die 230 may be formed of a plurality of layers and the second signal transmission part 262 may include a connecting part in the vertical direction (e.g., the z direction) that connects a horizontal (e.g., the x/y direction) part included in each layer and a horizontal (e.g., the x/y direction) part included in each layer.

In one example, the third signal transmission part 263 may be connected to the second die 240 (e.g., a signal transmission region of the second die 240) in the vertical direction (e.g., the z direction) from the second signal transmission part 262. For example, the third signal transmission part 263 may include a TSV.

In one example, a level shift circuit (not illustrated) may be arranged on the first signal transmission path 260. For example, the level shift circuit may be arranged on the second signal transmission part 262.

Figure 3:
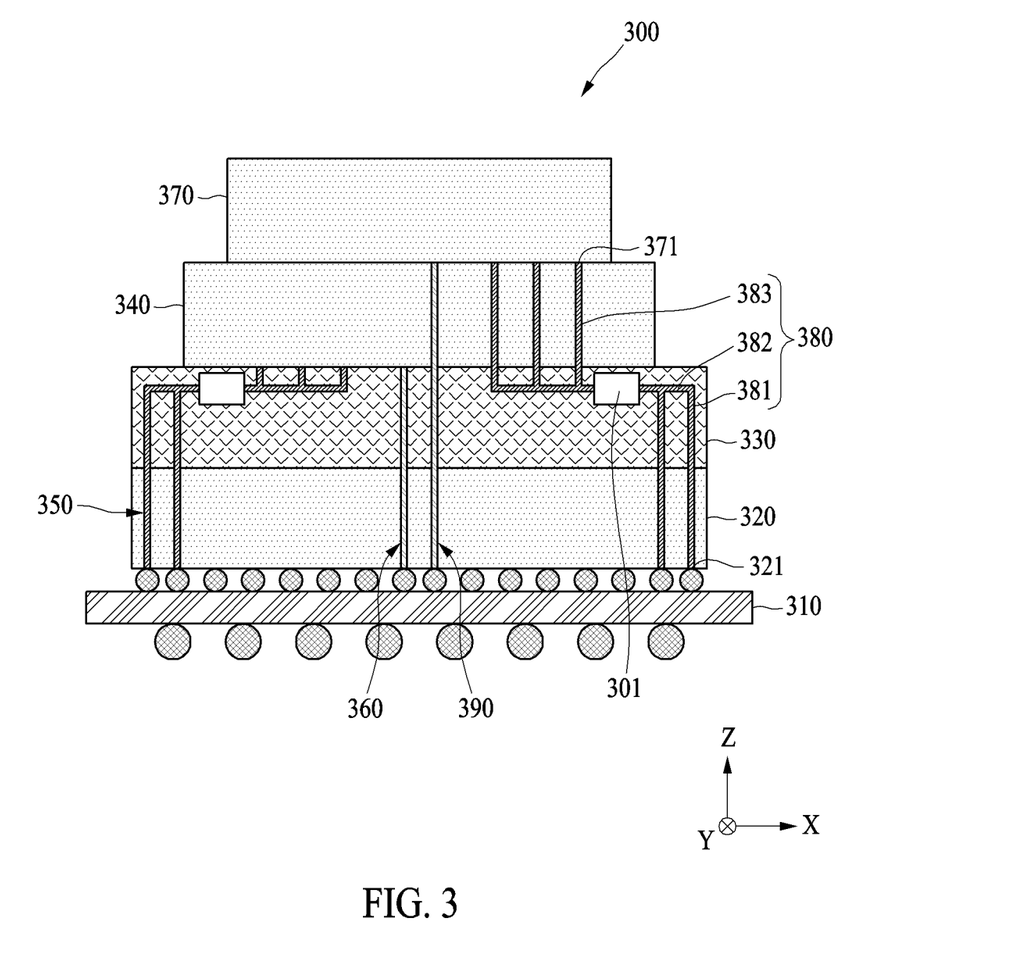
FIG. 3 is a schematic cross-sectional view illustrating an internal connection path of a stacked IC package according to an example.

FIG. 3 is a schematic cross-sectional view illustrating an internal connection path of a stacked IC package according to an example.

Referring to FIG. 3, a stacked IC package 300 according to one example may be formed by stacking a plurality of dies. For example, the stacked IC package 300 may include a package substrate 310, a first die 320, a first adapter die 330, a second die 340, a third die 370, a first power transmission path 350, a second power transmission path 380, a first signal transmission path 360, and a second signal transmission path 390. To describe the stacked IC package 300 with reference to FIG. 3, detailed descriptions that are substantially the same as those of the stacked IC package 100 provided with reference to FIGS. 1A to 1E are omitted. The description of the configuration of the stacked IC package 100 of FIGS. 1A to 1E may apply to the stacked IC package 300 of FIG. 3 without departing from the scope.

In one example, as illustrated in FIG. 3, the package substrate 310, the first die 320, the first adapter die 330, the second die 340, and the third die 370 may be sequentially stacked. For example, the first die 320 may be stacked on the package substrate 310, the first adapter die 330 may be stacked on the first die 320, the second die 340 may be stacked on the first adapter die 330, and the third die 370 may be stacked on the second die 340. The first die 320, the second die 340, and/or the third die 370 may be a memory die and/or a logic die. For example, the first die 320 may be a logic die, the second die 340 may be a logic die, and the third die 370 may be a logic die. However, this is merely an example, and the types of the first die 320, the second die 340, and the third die 370 is not limited thereto. For example, the third die 370 may include a third power transmission region 371.

In one example, a description of the first power transmission path 350 and the first signal transmission path 360 may be substantially and respectively the same as the description of the first power transmission path 150 and the first signal transmission path 160 described with reference to FIGS. 1A to 1E, and thus, the description thereof is omitted.

In one example, the second power transmission path 380 may be a path configured to transmit power between components (e.g., the package substrate 310, the first die 320, the second die 340, and/or the third die 370). For example, the second power transmission path 380 may be a path configured to transmit power from the package substrate 310 to the third die 370. The second power transmission path 380 may be electrically connected to the third power transmission region 371 of the third die 370 by passing through the first adapter die 330 and the second die 340 from a first power transmission region 321 of the first die 320. For example, at least a portion of the second power transmission path 380 may include a TSV. For example, at least one second power transmission path 380 may be provided.

In one example, the second power transmission path 380 may include a fourth power transmission part 381, a fifth power transmission part 382, and a sixth power transmission part 383.

In one example, the fourth power transmission part 381 may penetrate at least a portion of the first adapter die 330 in the vertical direction (e.g., the z direction) from the first power transmission region 321 of the first die 320. For example, the fourth power transmission part 381 may penetrate the lower portion (e.g., the portion in the −z direction) of the first adapter die 330 in the vertical direction (e.g., the z direction). For example, the fourth power transmission part 381 may include a TSV.

In one example, the fifth power transmission part 382 may be formed inside the first adapter die 330. The fifth power transmission part 382 may include a connected part in the horizontal direction (e.g., the x/y direction) from the fourth power transmission part 381 in the first adapter die 330. For example, the fifth power transmission part 382 may be formed on the top portion (e.g., the portion in the +z direction) of the first adapter die 330. For example, the fifth power transmission part 382 may be formed in a mesh type. The fifth power transmission part 382 illustrated in the drawings is an example and the fifth power transmission part 382 may include a connected part in the vertical direction (e.g., the z direction). For example, the top portion (e.g., the portion in the +z direction) of the first adapter die 330 may be formed of a plurality of layers and the fifth power transmission part 382 may include a connecting part in the vertical direction (e.g., the z direction) that connects a horizontal (e.g., the x/y direction) part included in each layer and a horizontal (e.g., the x/y direction) part included in each layer.

In one example, the sixth power transmission part 383 may be connected to the third power transmission region 371 of the third die 370 in the vertical direction (e.g., the z direction) by penetrating the second die 340 from the fifth power transmission part 382. For example, the sixth power transmission part 383 may include a TSV.

In one example, a voltage conversion circuit 301 may be arranged on the second power transmission path 380. For example, the voltage conversion circuit 301 may be arranged on the fifth power transmission part 382.

In one example, the second signal transmission path 390 may be a path configured to transmit a signal between components (e.g., the package substrate 310, the first die 320, the second die 340, and the third die 370). The second signal transmission path 390 may be electrically connected to the third die 370 from the package substrate 310 through the first die 320, the first adapter die 330, and the second die 340. For example, at least a portion of the second signal transmission path 390 may include a TSV. The second signal transmission path 390 may be formed in substantially the same structure as the second power transmission path 380. A level shift circuit (not illustrated) may be arranged on the second signal transmission path 390.

Figure 4:
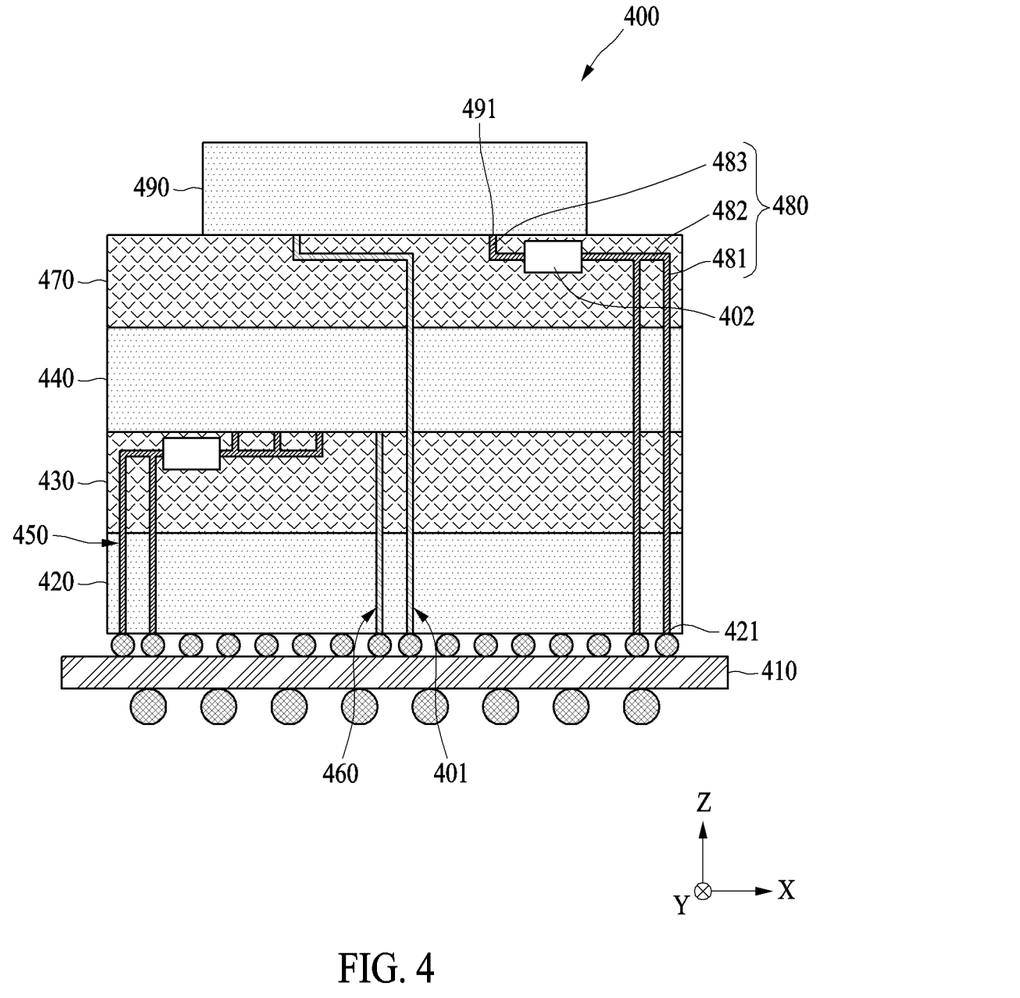
FIG. 4 is a schematic cross-sectional view illustrating an internal connection path of a stacked IC package according to an example.

FIG. 4 is a schematic cross-sectional view illustrating an internal connection path of a stacked IC package according to an example.

Referring to FIG. 4, a stacked IC package 400 according to one example may be formed by stacking a plurality of dies. For example, the stacked IC package 400 may include a package substrate 410, a first die 420, a first adapter die 430, a second die 440, a second adapter die 470, a third die 490, a first power transmission path 450, a second power transmission path 480, a first signal transmission path 460, and a second signal transmission path 401. To describe the stacked IC package 400 with reference to FIG. 4, detailed descriptions that are substantially the same as those of the stacked IC package 100 provided with reference to FIGS. 1A to 1E are omitted. The description of the configuration of the stacked IC package 100 of FIGS. 1A to 1E may apply to the stacked IC package 400 of FIG. 4 without departing from the scope.

In one example, as illustrated in FIG. 4, the package substrate 410, the first die 420, the first adapter die 430, the second die 440, the second adapter die 470, and the third die 490 may be sequentially stacked. For example, the first die 420 may be stacked on the package substrate 410, the first adapter die 430 may be stacked on the first die 420, the second die 440 may be stacked on the first adapter die 430, the second adapter die 470 may be stacked on the second die 440, and the third die 490 may be stacked on the second adapter die 470. The first die 420, the second die 440, and/or the third die 490 may be a memory die and/or a logic die. For example, the first die 420 may be a logic die, the second die 440 may be a logic die, and the third die 490 may be a logic die. However, this is merely an example, and the types of the first die 420, the second die 440, and the third die 490 are not limited thereto. For example, the third die 490 may include a third power transmission region 491.

In one example, a description of the first power transmission path 450 and the first signal transmission path 460 may be substantially and respectively the same as the description of first power transmission path 150 and the first signal transmission path 160 described with reference to FIGS. 1A to 1E, and thus, the description thereof is omitted.

In one example, the second power transmission path 480 may be a path configured to transmit power between components (e.g., the package substrate 410, the first die 420, the second die 440, and/or the third die 490). For example, the second power transmission path 480 may be a path configured to transmit power from the package substrate 410 to the third die 490. The second power transmission path 480 may be electrically connected to the third power transmission region 491 of the third die 490 by passing through the first adapter die 430, the second die 440, and the second adapter die 470 from a first power transmission region 421 of the first die 420. For example, at least a portion of the second power transmission path 480 may include a TSV. For example, at least one second power transmission path 480 may be provided.

In one example, the second power transmission path 480 may include a fourth power transmission part 481, a fifth power transmission part 482, and a sixth power transmission part 483.

In one example, the fourth power transmission part 481 may penetrate at least a portion of the second adapter die 470 in the vertical direction (e.g., the z direction) from the first power transmission region 421 of the first die 420 while penetrating the first adapter die 430 and the second die 440. For example, the fourth power transmission part 481 may penetrate the lower portion (e.g., the portion in the −z direction) of the second adapter die 470 in the vertical direction (e.g., the z direction). For example, the fourth power transmission part 481 may include a TSV.

In one example, the fifth power transmission part 482 may be formed inside the second adapter die 470. The fifth power transmission part 482 may include a connected part in the horizontal direction (e.g., the x/y direction) from the fourth power transmission part 481 in the second adapter die 470. For example, the fifth power transmission part 482 may be formed on the top portion (e.g., the portion in the +z direction) of the second adapter die 470. For example, the fifth power transmission part 482 may be formed in a mesh type. The fifth power transmission part 482 illustrated in the drawings is an example and the fifth power transmission part 482 may include a connected part in the vertical direction (e.g., the z direction). For example, the top portion (e.g., the portion in the +z direction) of the second adapter die 470 may be formed of a plurality of layers and the fifth power transmission part 482 may include a connecting part in the vertical direction (e.g., the z direction) that connects a horizontal (e.g., the x/y direction) part included in each layer and a horizontal (e.g., the x/y direction) part included in each layer.

In one example, the sixth power transmission part 483 may be connected to the third power transmission region 491 of the third die 490 in the vertical direction (e.g., the z direction) from the fifth power transmission part 482. For example, the sixth power transmission part 483 may include a TSV.

In one example, a voltage conversion circuit 402 may be arranged on the second power transmission path 480. For example, the voltage conversion circuit 402 may be arranged on the fifth power transmission part 482.

In one example, the second signal transmission path 401 may be a path configured to transmit a signal between components (e.g., the package substrate 410, the first die 420, the second die 440, and/or the third die 490). The second signal transmission path 401 may be electrically connected to the third die 490 from the package substrate 410 through the first die 420, the first adapter die 430, the second die 440, and the second adapter die 470. For example, at least a portion of the second signal transmission path 401 may include a TSV. The second signal transmission path 401 may be formed in substantially the same structure as the second power transmission path 480. A level shift circuit (not illustrated) may be arranged on the second signal transmission path 401.

Moreover, the stacked IC packages 300 and 400 of FIGS. 3 and 4 are examples, and the stacked IC package according to one example may be formed by stacking dies in various orders.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A stacked integrated circuit (IC) package comprising:
   a first die comprising a first power transmission region;
   a first adapter die stacked on the first die;
   a second die stacked on the first adapter die and comprising a second power transmission region; and
   a first power transmission path electrically connected between the second power transmission region and the first power transmission region through the first adapter die,
   wherein the first power transmission path comprises:
   a first power transmission part penetrating at least a portion of the first adapter die in a vertical direction from the first power transmission region;
   a second power transmission part comprising a connected part in a horizontal direction from the first power transmission part in the first adapter die; and
   a third power transmission part connected to the second power transmission region in the vertical direction from the second power transmission part, and
   a voltage conversion circuit is arranged on the first power transmission path.

2. The stacked IC package of claim 1, wherein at least a portion of the first power transmission region does not overlap the second power transmission region in the vertical direction.

3. The stacked IC package of claim 1, wherein the voltage conversion circuit is arranged on the second power transmission part.

4. The stacked IC package of claim 1, wherein the second power transmission part is formed of a mesh type.

5. The stacked IC package of claim 1, wherein the first adapter die comprises silicone or a metal material and is configured to distribute heat generated in the first die or the second die.

6. The stacked IC package of claim 1, wherein the first die comprises a first signal transmission region,
   the second die comprises a second signal transmission region, and
   the stacked IC package comprises a first signal transmission path electrically connected between the second signal transmission region and the first signal transmission region through the first adapter die.

7. The stacked IC package of claim 6, wherein the first signal transmission path comprises:
   a first signal transmission part penetrating at least a portion of the first adapter die in the vertical direction from the first signal transmission region;
   a second signal transmission part comprising a connected part in the horizontal direction from the first signal transmission part in the first adapter die; and a third signal transmission part connected to the second signal transmission region in the vertical direction from the second signal transmission part.

8. The stacked IC package of claim 7, wherein at least a portion of the first signal transmission region does not overlap the second signal transmission region in the vertical direction.

9. The stacked IC package of claim 6, further comprising a level shift circuit arranged on the first signal transmission path.

10. The stacked IC package of claim 1, further comprising a static read-only memory (SRAM) and at least one of a power management circuit for the first die and a power management circuit for the second die arranged in the first adapter die.

11. The stacked IC package of claim 1, further comprising:
a third die stacked on the second die and comprising a third power transmission region; and
a second power transmission path electrically connected between the third power transmission region and the first power transmission region through the first adapter die and the second die,
wherein the second power transmission path comprises:
a fourth power transmission part penetrating at least a portion of the first adapter die in the vertical direction from the first power transmission region;
a fifth power transmission part comprising a connected part in the horizontal direction from the fourth power transmission part in the first adapter die; and
a sixth power transmission part connected to the third power transmission region in the vertical direction from the fifth power transmission part by penetrating the second die, and
a second voltage conversion circuit is arranged on the fifth power transmission part.

12. The stacked IC package of claim 1, further comprising:
a second adapter die stacked on the second die;
a third die stacked on the second adapter die and comprising a third power transmission region; and
a second power transmission path electrically connected between the third power transmission region and the first power transmission region through the first adapter die, the second die, and the second adapter die,
wherein the second power transmission path comprises:
a fourth power transmission part penetrating at least a portion of the second adapter die in the vertical direction from the first power transmission region by penetrating the first adapter die and the second die;
a fifth power transmission part comprising a connected part in the horizontal direction from the fourth power transmission part in the second adapter die; and
a sixth power transmission part connected to the third power transmission region in the vertical direction from the fifth power transmission part, and
a second voltage conversion circuit is arranged on the fifth power transmission part.

13. A stacked integrated circuit (IC) package comprising:
a logic die comprising a first power transmission region;
an adapter die stacked on the logic die;
a memory die stacked on the adapter die and comprising a second power transmission region; and
a power transmission path electrically connected between the second power transmission region and the first power transmission region through the adapter die,
wherein the power transmission path comprises:
a first power transmission part penetrating at least a portion of the adapter die in a vertical direction from the power transmission region;
a second power transmission part comprising a connected part in a horizontal direction from the first power transmission part in the adapter die; and
a third power transmission part connected to the second power transmission region in the vertical direction from the second power transmission part,
wherein a voltage conversion circuit is arranged in the second power transmission part, and
at least a portion of the first power transmission region does not overlap the second power transmission region in the vertical direction.

14. The stacked IC package of claim 13, wherein the second power transmission part is formed of a mesh type.

15. The stacked IC package of claim 13, further comprising a power management circuit for the memory die arranged in the adapter die.

16. The stacked IC package of claim 13, wherein the logic die comprises a first signal transmission region,
the memory die comprises a second signal transmission region, and
the stacked IC package comprises:
a first signal transmission path electrically connected between the second signal transmission region and the first signal transmission region through the adapter die.

17. A stacked integrated circuit (IC) package comprising:
a first die;
an adapter die disposed on the first die along a first direction;
a second die disposed on the adapter die along the first direction such that the adapter die is at least partially disposed between the first die and the second die;
a first power transmission part extending along the first direction from a first end disposed at the first die to a second end disposed at the adapter die;
a second power transmission part extending along the first direction from a first end disposed at the second die to a second end disposed at the adapter die;
a third power transmission part extending in the first adapter die along a direction traverse to the first direction from the second end of the first power transmission part to the second end of the second power transmission part; and
a voltage conversion circuit arranged on one of the first power transmission part, the second power transmission part, and the third power transmission part.

18. The stacked IC package of claim 17, wherein the voltage conversion circuit is arranged on the third power transmission part.

19. The stacked IC package of claim 17, wherein the first die is a logic die and the second die is a memory die.

20. The stacked IC package of claim 17, wherein the first end of the first power transmission part is disposed in a first power transmission region of the first die, and the first end of the second power transmission part is disposed in a second power transmission region of the second die.

* * * * *